(12) United States Patent
Hayes

(10) Patent No.: US 6,830,643 B1
(45) Date of Patent: Dec. 14, 2004

(54) METHOD OF MANUFACTURING AN ITEM AND APPARATUS FOR MANUFACTURING AN ITEM

(76) Inventor: Jonathan Hayes, 12 Copse Close, Oadby, Leicester LE2 4FB (GB)

(*) Notice: Subject to any disclaimer, the term of this patent is extended or adjusted under 35 U.S.C. 154(b) by 0 days.

(21) Appl. No.: 10/130,509

(22) PCT Filed: Nov. 16, 2000

(86) PCT No.: PCT/GB00/04359
§ 371 (c)(1),
(2), (4) Date: Sep. 3, 2002

(87) PCT Pub. No.: WO01/36171
PCT Pub. Date: May 25, 2001

(30) Foreign Application Priority Data

Nov. 16, 1999 (GB) .............................. 9927127

(51) Int. Cl.$^7$ ............................................. B32B 31/00
(52) U.S. Cl. ................. 156/241; 156/247; 156/284; 156/289; 156/305; 156/307.3; 156/308.2; 156/356; 156/563; 118/697; 118/45; 118/46; 118/56; 118/308; 427/34; 427/69; 427/113; 427/125; 427/126; 427/128; 427/131; 427/207.1; 427/334
(58) Field of Search ................................. 156/155, 230, 156/241, 247, 276–279, 283, 284, 289, 291, 305, 307.1, 307.3, 308.2, 320, 321, 356, 390, 538, 563, 358; 118/697, 45, 46, 56, 308, 312; 264/34, 69, 109, 112, 113, 125, 126, 128, 131, 298, 308; 425/425, 130, 217, 218, 424; 427/160, 207.1, 331, 334

(56) References Cited

U.S. PATENT DOCUMENTS

| | | | | |
|---|---|---|---|---|
| 5,015,312 A | * | 5/1991 | Kinzie ........................ | 156/63 |
| 5,088,047 A | | 2/1992 | Bynum | |
| 5,114,744 A | * | 5/1992 | Cloutier et al. .............. | 427/96 |
| 5,387,380 A | * | 2/1995 | Cima et al. .................. | 264/69 |
| 5,622,577 A | | 4/1997 | O'Connor | |
| 5,879,489 A | * | 3/1999 | Burns et al. .................. | 156/64 |

FOREIGN PATENT DOCUMENTS

| | | |
|---|---|---|
| EP | 0470705 | 2/1992 |
| EP | 0686481 | 12/1995 |
| EP | 0738583 | 10/1996 |
| WO | 9526871 | 10/1995 |
| WO | 9828124 | 7/1998 |
| WO | 9856566 | 12/1998 |

* cited by examiner

*Primary Examiner*—Melvin C Mayes
*Assistant Examiner*—Sing Po Chan
(74) *Attorney, Agent, or Firm*—Wood, Phillips, Katz, Clark & Mortimer

(57) ABSTRACT

A method of manufacturing an item comprises the steps of: controlling a printer means to print a layer of retaining material in a predetermined pattern onto a substrate; applying a manufacturing material to be retained by the retaining material in substantially the predetermined pattern; treating the manufacturing material so that it forms a continuous solid piece in substantially the predetermined shape of the pattern, or, where the pattern is made up of distinct parts, in substantially the predetermined shape of each distinct part of the pattern.

60 Claims, 3 Drawing Sheets

METHOD OF MANUFACTURING AN ITEM AND APPARATUS FOR MANUFACTURING AN ITEM

The invention relates to a method of manufacturing an item and an apparatus for manufacturing an item.

Known methods of manufacturing include injection moulding and die-casting. The manufacture of tooling for injection moulding or die-casting is a highly restrictive burden on industry, because of it's high cost and lead times. Similar things are true of the cost of tooling for punch pressing, while the time taken by processes such as photo-chemical machining, electro and electroless plating and the environmental issues that surround these processes limit their use. The cost and the time taken to post-assemble products substantially reduces the flexibility and competitiveness of manufacturing industry.

So-called "Solid Free Form" (SFF) manufacture systems have been used in Rapid Prototyping (RP) applications starting in 1988 with 3D Systems's introduction of their Stereolithography systems. The growth in the RP market has stimulated an accelerating rate of technological development in the field., and firms have developed different types of commercial systems for specific RP applications.

Solid Free Form (SFF) manufacture is essentially the computer controlled additive manufacture of three-dimensional physical forms. All of the commercial SFF systems employ the same basic principle. CAD data of the desired component is sliced into a number of horizontal layers. Each of these layers is built in turn on top of the preceding layer, by the precise addition of material, until the object has been completed. SFF manufacture also encompasses the computer-controlled manufacture of objects comprised of a single layer plus any other additive method of manufacture.

All of the commercial systems use direct computer control of their additive manufacturing processes. Consequently, the main advantages that these systems have over machining and moulding processes is that they can produce a one-off object with complex geometry far more flexibly and quickly than machining and moulding can. The main problem with all of these systems is that they cannot manufacture large batches of duplicate objects as fast as machining and moulding can. These systems have extremely limited capabilities for producing SFF objects with surface or internal colour, tone or doping. Furthermore, none of them can produce objects that are comprised of parts that are made of entirely different materials to the other parts.

Stereolithography RP systems work by using an UV laser to selectively expose the surface of liquid Ultra Violet (UV) reactive polymer to UV radiation (typically from a laser source). This causes the polymer to cure into a solid in the exposed area. The polymer that has been solidified is a physical realisation of a slice of a CAD model. The solidified material is supported on a platform. A new flat area of liquid UV reactive polymer is then laid over this layer by lowering of the platform into the liquid, and the exposure process is repeated to form another layer that bonds to the previous one. This process is repeated until the entire part has been completed.

Another UV polymer curing system is Cubital Ltd's Solid Ground Curing (SGC) RP system. Here a thin layer of UV reactive polymer resin is spread over a platform and then exposed to UV radiation shone through a patterned mask. The transparent areas of the mask correspond to the required cross sections of a CAD model, and the UV radiation that passes through these areas cures part of the polymer layer into the pattern of the required cross section. Ionography technology is used to produce the masks that represent the required cross sections, and once a mask has been used it is erased and then re-imaged and inked with a new mask. A residual polymer cleaner removes the uncured polymer and then a spreader coats the cured polymer in wax. A cooling plate is used to accelerate the solidification of the wax, and once this has solidified it is milled flat by a milling head. The above processes are repeated until the entire model has been built. The wax is removed from the finished products by melting it away with hot (60° C.) water.

By their nature all of the commercial polymer curing systems are limited to manufacturing objects out of UV reactive polymer. Consequently, the physical properties of these objects are not suitable for many functional applications.

Selective sintering systems have enabled objects to be made out of a wide range of powdered materials. As an example, one selective sintering method works by spreading a heat fusible powder on top of a moveable platform that can be lowered within a cylinder that defines the maximum part volume. The layer of powder is then selectively fused by a laser that defines the layer of the CAD model. The platform is lowered and a new layer of powder is deposited and subsequently selectively fused to the preceding layer. This process is repeated until the object is completed.

By combining materials and coating the powders with various binders, it is possible to make specialised powders, tailored to particular functional applications.

Another rapid prototyping technique is "laminated object manufacture" (LOM). In this technique, objects are built by sticking sheets of material together. An uncut sheet is laid down and a heated roller is passed over it, which causes a coating of heat sensitive glue on the sheet to adhere it to the underlying sheet. A laser is then used to cut the sheet to the desired shape. Another layer is then added to the stack and the process is repeated. Most of the LOM RP systems are limited to manufacturing objects out of paper and polymers. Consequently, the physical properties of these objects are not suitable for many functional applications.

The "Fused Deposit Modelling" (FDM) process uses low diameter thermo polymer wire-like filaments, which are extruded in a hot semi-molten form from a delivery head. The motion of the delivery head is computer-controlled. This allows the filament to be extruded in a pattern that depicts a layer of the required object and the object is built up in a layer-wise fashion out of the extruded layers that bond together when they cool. The cost of converting the thermo polymer to a filament can be extremely high and so objects that contain a large volume of the extruded filament can be extremely costly in comparison to injection moulded objects.

The use of hot melt jet printing technology in rapid prototyping is quite a new development. The principle is relatively straightforward. Solid ink is loaded into an ink reservoir and then heated so that the molten ink runs off and is channeled into a piezo-electric jet printer head. The printer then ejects the ink in molten droplet form onto a substrate upon which the droplets cool and thus solidify and adhere. Some systems, such as Sanders Prototyping's Model Maker II use continuous-flow jet printers and others such as 3D Systems Actua 2100 use drop-on-demand (DOD) impulse jet printers. At present, these systems are limited to manufacturing objects out of waxes and thermo polymers. Consequently, the physical properties of these objects are not suitable for many functional applications.

MITs 3DP system and the Soligen Inc DSPC and Extrude Hone Corp.'s Prometal licensed versions use a different method from the previously mentioned selective sintering, but objects are still built by putting down a layer of powder. The difference is that the powder layers are bound together using a continuous jet printer to deposit a binder or solvent selectively onto the powder, and repeating the process consecutively until the required three dimensional object is constructed. Finally the object is removed from the loose powder and any unbound powder left on the object or trapped in inclusions is cleaned away.

Topographic Shell Fabrication (TSF) is a proprietary RP technology developed by Formus, USA. The TSF system is designed for manufacturing ultra large objects that can be the size of cars or even larger. The TSF system is comprised of a chamber, a layering device that deposits consecutive horizontal layers of silica powder into the chamber and a nozzle that selectively infiltrates a paraffin wax binder into the powder.

Objects of aspects of the invention are as follows:

The production of SFF objects out of a broad range of engineering and/or electronic materials.

A cost-effective SFF alternative to processes such as injection moulding, die casting, photo-chemical machining, electroless plating, electro plating, laminated circuit board manufacture or punch pressing.

An SFF system capable of competing with mass-production rates of processes such as injection moulding, die casting, photo-chemical machining, electroless plating, electro plating or punch pressing.

The direct SFF manufacture of SFF objects with a number of components, each made of different materials and/or more than one surface colour. This reduces or eliminates the post-assembly requirements currently associated with the manufacture of such objects.

An SFF system that is more environmentally friendly than processes such as injection moulding, die-casting, photo-chemical machining, electroless plating, electro plating or punch pressing.

The provision of and if required the subsequent removal of physical support for overhangs, large spans and disjointed volumes involved in a SFF object.

According to one aspect of the invention there is provided a method of manufacturing an item comprising the steps of:

controlling a printer means to print a layer of retaining material in a predetermined pattern onto a substrate;

applying a manufacturing material to be retained by the retaining material in substantially the predetermined pattern;

treating the manufacturing material so that it forms a continuous solid piece in substantially the predetermined shape of each distinct part of the pattern.

In this way, items can be manufactured rapidly and using equipment that is readily available and inexpensive.

According to another aspect of the invention there is provided apparatus for manufacturing an item including:

printer means for printing a layer of retaining material in a predetermined pattern on a substrate;

means for applying a manufacturing material to be retained by the retaining material in substantially the predetermined pattern; and, means for treating the manufacturing material so that it forms a continuous solid piece in substantially the predetermined shape of each distinct part of the pattern.

The retaining material can take any suitable form. Thus, for example, it may comprise conventional printing ink, or may comprise water in a preferred embodiment. The retaining material may be arranged to be removed, suitably after or during treatment, for example, by evaporation. Alternatively, the retaining means may be arranged to be incorporated into the finished item, for example, by curing of an appropriate retaining means. In that case the retaining means may be coloured to result in colour in the manufactured item, for example on the surface of the item or internally. Similarly, different tones can be incorporated or other desirable characteristics such as doping can be achieved. Different retaining means may be used for different parts of the item to result in different colours or other characteristics. Indeed different retaining means may be used for the same part of an item so that for example colours can be mixed. Conveniently then the colours cyan, magenta, yellow, black and white may be used to enable the complete colour spectrum to be reproduced. The retaining material may be or have as a constituent a solvent, organometal, glue, decomposable material, curable material, or a low melting point material that can reduce the energy required to bond the powders involved in the method. In addition, if the retaining material contains glue or a low melting point material this may subsequently be used to aid the separation of solid material from the substrate. The retaining material may also be designed to allow catalytic reactions that promote or result in the solidification of the solid piece. In addition, the retaining material may also contain or be a parting agent.

The manufacturing material may be applied in any suitable form and may for example be applied as a liquid but preferably is applied as a powder. The powder may be applied in any suitable way such as:

by blowing the powder;

by electrostatically attracting or repelling the powder;

by electromagnetically attracting or repelling the powder;

by passing a substrate and its pattern through powder;

or by shaking powder onto the retaining material.

A coating roller may be rolled over the applied powder. This will promote even distribution, density and adherence of the powder. A number of different manufacturing materials may be applied in manufacture of the same item to result in different properties and/or colours. The manufacturing material may incorporate additional material to aid retention and/or to aid formation of the material into a continuous solid piece.

Excess manufacturing material is preferably removed before the step of treating the manufacturing material. The excess manufacturing material may be removed in any suitable way such as by blowing away the powder, by electrostatically attracting or repelling the powder, by electromagnetically attracting or repelling the powder, or shaking away the powder. Conveniently, the powder is removed by the accelerating the flow of a localised zone of atmosphere that is in close proximity to the powder. Preferably, the removed powder is recycled. The step of removal of excess powder will remove loose powder as well as removing any powder that is not well adhered to the retaining material.

If the manufacturing material needs to be supported, support material can be formed in a pattern that will give the required support. The support material may be of any type that may be easily removed from an item for example by mechanical, chemical, thermal or a combination or combinations of these means of removal. The material involved in the support must be capable of providing the required steadiness of hold for an item, and preferably, it should be solid at room temperature and in a powder form. The support material may be formed as follows:

by printing, applying and treating some substrates so that they have the support's layers on them and others so that they have the item's layers on them;

by printing, applying and treating a substrate so that a pattern of support is formed around a layer of an item that has previously been made but not deposited onto a platform or stack of layers;

by making the support out of the same material as the item and by using a pattern that produces fine structures of support that can be easily removed when the item is finished;

by depositing the support material where the support is required about a platform or stack of item layers;

by making the support out of the same material as the item and by printing, applying and treating so that a release agent is formed on the support. (This allows the support material to be easily removed when the item is finished);

by making the support out of the same material as the item and by printing release agent onto the support so that fine structures of support are formed that can be easily removed when the item is finished.

The support material may be applied after the excess manufacturing material has been removed.

The types of powders used are designed to act as the material for part, parts or all of an item, or the support for the item or combinations of these. Each type of powder can contain different particle sizes or distributions of particle sizes, and this can be used to enhance the properties of an item or support. Generally, the production processes for powders become more costly and wasteful as the particle sizes become smaller. Consequently, the use of different particle sizes can be used to reduce the cost of manufacture.

The manufacturing material may be treated in any appropriate way and may be treated by the application of energy for example in the form of heat, electrons, ionising radiation (for example, electrical, electromagnetic or ultrasonic radiation) or ultra violet radiation. In one preferred embodiment the manufacturing material is treated by means of shining a halogen lamp or lamps or one or more ceramic infrared emitters thereonto, and this may be used to turn the manufacturing material into a solid piece. Where heat is used, the method may then include controlling the heat and this may involve cooling the manufacturing material. This can increase the speed with which the next step can take place and can render the system more efficient. Means such as a roller mechanism may be used to compress and increase the density the treated manufacturing material.

Preferably, means is provided to adjustably control the height of the manufacturing material applied. The height control means may take any suitable form. Means to adjustably control the amount of manufacturing material applied may be provided and this may comprise the height control means. The control means may control the rate of application of manufacturing material, for example, by increasing or reducing the size of an aperture through which manufacturing material is applied, or by adjusting the vibration of the application device. In another embodiment and where the means for applying the manufacturing material moves relative to the substrate the control means may control how long the manufacturing material is applied for by controlling dwell time or speed of relative movement.

The substrate may be made of any suitable material such as paper, card, silicone or vulcanised rubber, cellophane or cellulose acetate, or may be made of metal such as stainless steel, nickel, nickel alloy, platinum, platinum alloy, tantalum, molybdenum, tungsten, titanium, vanadium, aluminium or aluminium alloy. Alternatively, the substrate may be made out of other strong engineering materials, for example composite materials. The substrate may be made of muscovite or phlogopite paper, woven or non-woven glass fibre, graphite composite or carbon fibre composite, kevlar (trade mark), glass, mica, or ceramic materials, such as alumina and alumina paper. Preferably, the substrate is made of a material that can be used again in the method, preferably without or with limited preparatory treatment before reuse. In another embodiment of the invention, the substrate is not reused and it can be dissolved, abraded, cut or burnt away or even peeled off or left in place. If the substrate is reused it is preferable that it is then returned to the printer means so that it can be used in the method as many times as it is required or is technically feasible to do so. In one embodiment, the solid material is used attached to the substrate but in a preferred embodiment, the solid material is separated from the substrate. In this case the substrate may then be made of or may include a coating of material to aid separation such as PVDF, PFA, PTFE, silicone, graphite, boron nitride or wax.

Not limiting the scope of the invention the substrates can be made in the form of cut sheets, web fed sheet, a continuous belt or a number of cylinders.

The method may be used for making thin items such as solder pre-forms, circuit boards, alternatives to die cut, punch pressed or pierced items, floor coverings, work surfaces or any other thin item that may have mechanical, electrical or optical applications or combinations of these applications. Consequently, the application of a single layer of manufacturing material may result in the final item. However, in many cases the method will further include the steps of aligning a plurality of the pieces of thus formed solid material and connecting the pieces together in a stack.

Each piece is aligned with the stack prior to it being applied to the stack, and a purely mechanically device can be used to ensure the alignment. This can involve using substrate or substrates that have edges, holes, lumps, recesses, pins, combinations of these or other mechanical registration aids that enable a purely mechanical device to align the substrates and pieces. In this instance, the printer may use the same or a similar device to control the alignment of its print, or the aids can be produced in register with the print. Even so, it is preferred that the alignment be controlled by a motor, sensor and controller arrangement. Preferably an indexing mark is applied to each substrate and the indexing mark is used in the alignment. In this instance, the sensor detects an indexing mark that has been made in alignment with the printed pattern on the substrate, and it then signals the controller motor unit to move the piece into alignment with the stack. The indexing mark may be applied after or preferably during the application of the manufacturing material. In another embodiment of the invention, the sensor detects an indexing mark that was used to register the printing of the pattern, and it then signals the controller motor unit to move the piece into alignment with the stack. Alternatively, a sensor, controller, motor unit can register a platform with piece prior to connecting the piece with a platform or a stack. Furthermore, the method may also involve organising the substrates and their pieces so that they are subsequently deposited in correct order in relation to one another. At the point of connecting the pieces together in a stack, stack height control is performed, and this can be achieved for example by the use of stacks of micrometers, shims or a Z motion control device.

The retaining means is preferably applied to only one of the surfaces of the substrate, preferably the top surface of the substrate. The substrate may then be moved, for example, inverted, so that the solid material is aligned. The substrate can then be moved so that the solid material is deposited, for example, downwards, on a platform or on stack of solid material layers so causing the deposited solid material to form another layer on the stack. The deposition can be done in such a way that the solid material forms the main contact with the platform or stack in comparison to the contact of the retaining means if there is any at all. The deposition can be continued in this way until the required item is manufactured. In fact, in this case the item is composed of a plurality of item layers in a stack.

Duplicate layers may be consecutively constructed from common printing means. There are particular advantages in doing this in that the same pattern can be applied as many times as the number of identical layers being manufactured. Changing the pattern to be printed takes time and processing power, whereas repeating a pattern can be done rapidly. This increases the speed of manufacture because the changing of patterns is likely to be a major factor that may slow the speed. It is thus much quicker to make duplicate layers consecutively in this way than it is to change to produce a new pattern for each duplicate layer. The means for applying manufacturing material may be specific to the printer means, or common to a number of printer means and preferably further the means for treating the manufacturing material may be specific to the applying means or common to a number of applying means. In addition, the patterns for duplicate and dissimilar layers may be concurrently printed from a number of printing means, and this may be used to increase the speed at which items can be manufactured.

Several items may be constructed concurrently from common printing means. This increases the speed of manufacture as the printing is likely to be the fastest step of the method and it renders the system more efficient. Changing the pattern to be printed takes time and processing power, whereas repeating a pattern can be done rapidly. It is thus much quicker to make two items concurrently in this way than to make them one after the other using the same apparatus. Preferably, the means for applying manufacturing material is also common and preferably further the means for treating the manufacturing material is also common.

The pieces of solid material in layers may be connected in any suitable way as appropriate to the manufacturing material used and/or the retaining material where that is incorporated at the contact surface. Thus, the pieces of solid material in layers may be connected by the controlled application of pressure and/or ultrasonic energy, heat, ultraviolet radiation, ionising radiation, organometal, glue, solvent or combinations of these. In another embodiment of the invention, a cooling device is used to cool and thus stabilise each layer after or during its deposition onto the stack or platform.

Where the substrate is removed from the manufacturing material it may be removed at the stage when the solid material thereon has been placed on or connected together on a stack.

The method may be conducted in a controlled atmosphere that may be neutral or may be arranged to cause beneficial interactions.

A computer may control the pattern that a printer means prints. It is preferable that this control is by means of the conversion of data from a CAD data via a slicing algorithm into an image form such as bitmap form.

The printer means can be a printer of any suitable type and preferably comprises a jet printer and may or alternatively comprise a computer to plate printer, direct imaging printer or a screen printer. The jet printer may for example be a continuous flow jet printer, a thermal jet printer, an impulse jet printer, a valve jet printer or a spray jet printer.

Not limiting the scope of the invention, the support material may be a polymer such as phenolic, epoxy, polyethylene oxide, polyethylene glycol, polyvinyl alcohol, polyvinyl acetate, poly (2-ethyl-2-oxazoline) or nylon. Sugar such as maltose, fructose or glucose can also be used as a support and salts such as magnesium oxide, magnesium hydroxide, calcium oxide, calcium hydroxide, sodium oxide or sodium hydroxide, sodium chloride can be used as an alternative. Ceramic materials such as alumina, zirconium silicate, molochite, china clay or silica may be used, and metals such as zinc or tin may be used. Wax, resin, gelatin, talc, starch or gum arabic may also be used a support material. A combination of a number of the previously mentioned materials may be used. The support material may also be a material that is soluble in water or organic solvent Not limiting the scope of the invention, the manufacturing material can be a polymer such as nylon, polycarbonate, polystyrene, phenolics, polyethylene, ABS or epoxies. Metals such as zinc, tin, solders, copper, stainless steels, steel, tungsten carbide/cobalt, bronze or aluminium may also be used for manufacturing material. Powders that are or are based on ceramic materials such as silica, zirconium silicate, molochite, china clay, alumina may also be used. The material may also be comprised of or incorporate a glass. The material may also be a combination of a number of the previously mentioned materials.

An embodiment of the invention will now be described by way of example and with reference to the accompanying drawings, in which.

Figure 1:
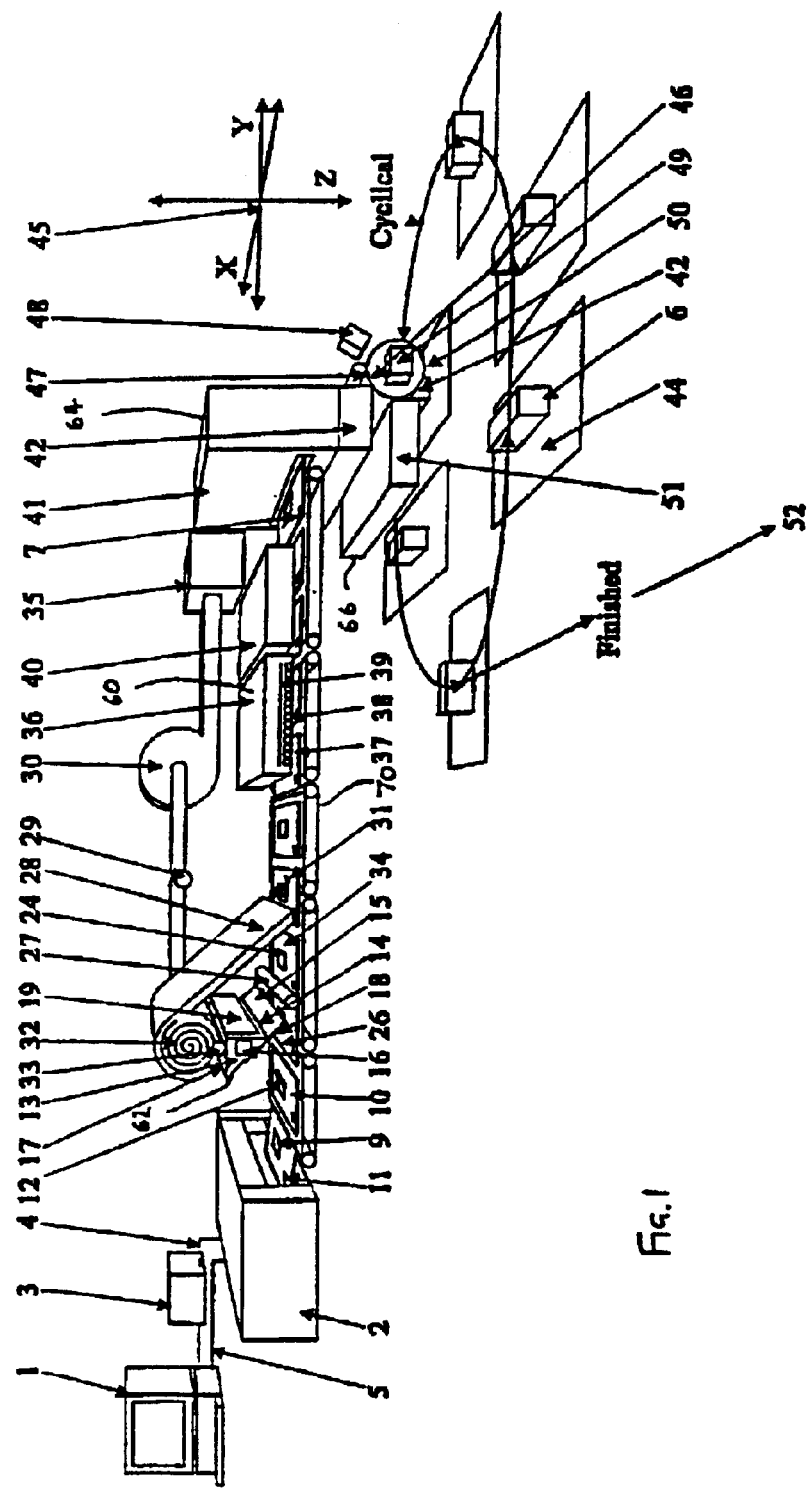
FIG. 1 is a perspective view of the apparatus of the embodiment of the invention.

The preferred embodiment of the invention is primarily concerned with a computer-controlled method of SFF manufacture of objects that can be used for electronic, electrical, mechanical, decorative, medical, structural, optical, chemical or any other suitable application. The objects can also be used in place of the products produced by injection moulding, die casting, investment casting, photochemical machining, electroless plating, electro plating, die cutting or punch pressing. The precise method of SFF manufacture is as follows:

As shown in FIG. 1, Computer data (1) is provided that can be used to control and define the images produced by a printer (2). This can involve sending the data to a print driver or raster image processor (RIP) (3), which converts it into a bitmap (4) or the data can be provided as a bitmap (5). The printer (2) is a jet printer. A bitmap (4 or 5) is used to control the jet printer printing order to print an image of the bitmap.

The printer (2) is used to print latent images (9) onto a number of substrates (10). At the same time it also prints indexing marks (11) that are in registration with the images. The printing involves the use of one or more types of printing ink (12), and the ink (12) is of a type that allows powder to adhere to the print in the subsequent machine (60) that uses thermographic principles. Several inks are used to allow different types of surface or internal colour, tone or doping to be produced in or on objects (6). The inks are cyan, magenta, yellow, black and white and these colours can be printed individually or in combination in the usual way. This allows colours to be overlapped or dithered so that the full colour spectrum and range of tints can be obtained. The substrates (10) are made of card and are supplied from a stack held within the printer (2) in the usual way.

After each latent image (9) has been printed onto a substrate (10), it is fed into the machine (60) that uses thermographic principles to make SFF layers on the latent images. This is comprised of a powder-coating device (62), a powder removal device (27), an emitter (36), a rotating coating bar (27) and an energy control device (40).

The powder-coating device (62) deposits powder onto the substrates (10) and their latent images. The powder-coating device (62) is comprised of a reservoir (13) with an aperture (14) at its base, a mesh or grill (15) placed underneath the aperture (13) and a vibrator (16) which shakes the entire powder-coating device (62). To cause the powder-coating device (62) to work, its reservoir (13) must be loaded with virgin powder (17) and the vibrator (16) turned on. This causes the entire powder-coating device (62) to vibrate so that the powder passes through the aperture (14) and onto the mesh or grill (15). The vibrating mesh or grill (15) then sifts the powder (17) so that it falls evenly through and is dusted (18) onto a substrate (10) and its latent image (9) as it is fed into the machine. The rate of dusting can be altered and controlled by tightening or loosening a mechanism (19) that increases or decreases the aperture's (14) size.

Figure 2B:
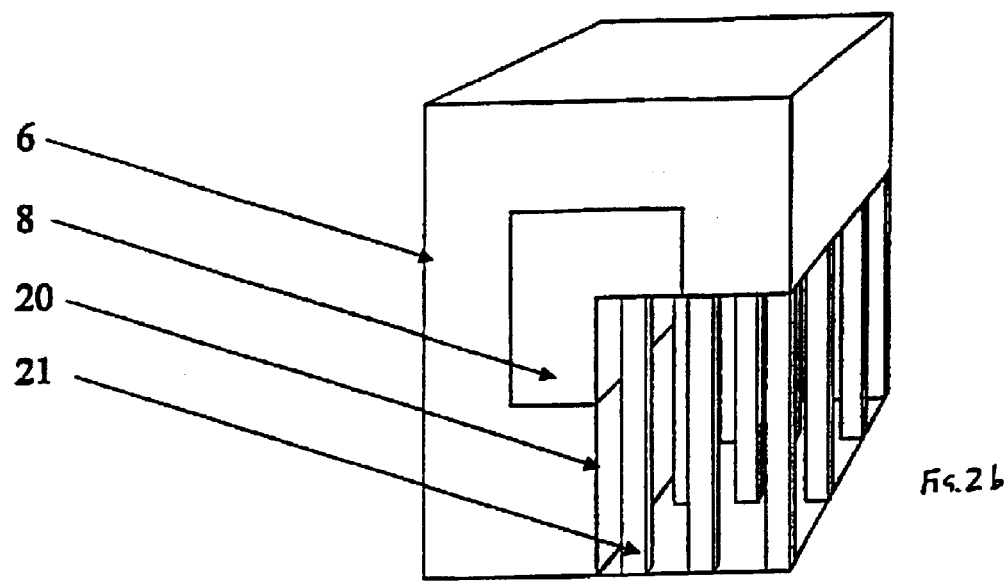
FIG. 2a is a perspective view of an item and support material made by the apparatus of FIG. 2b is the view of FIG. 2a with the support material removed.
Figure 2A:
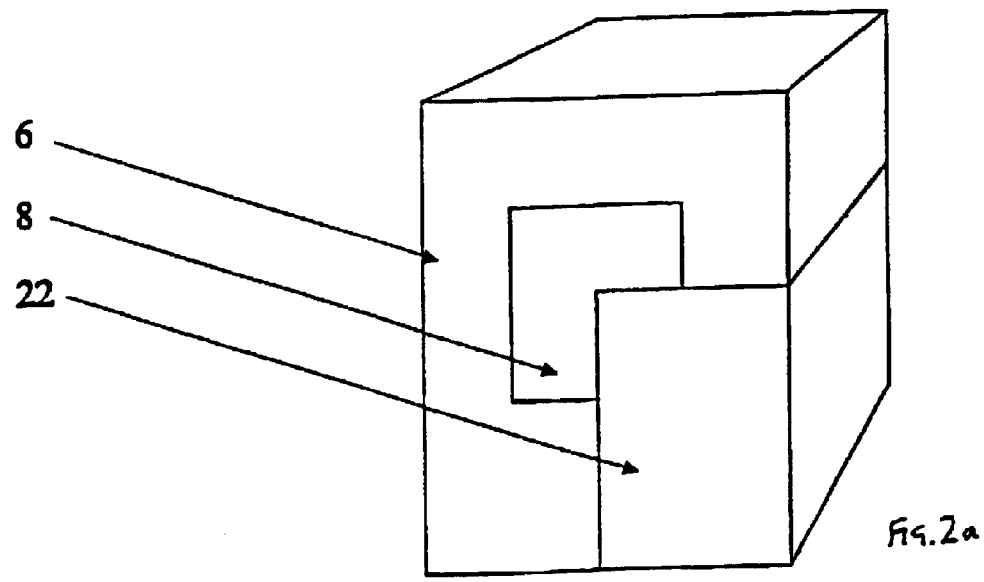
Figure 3:
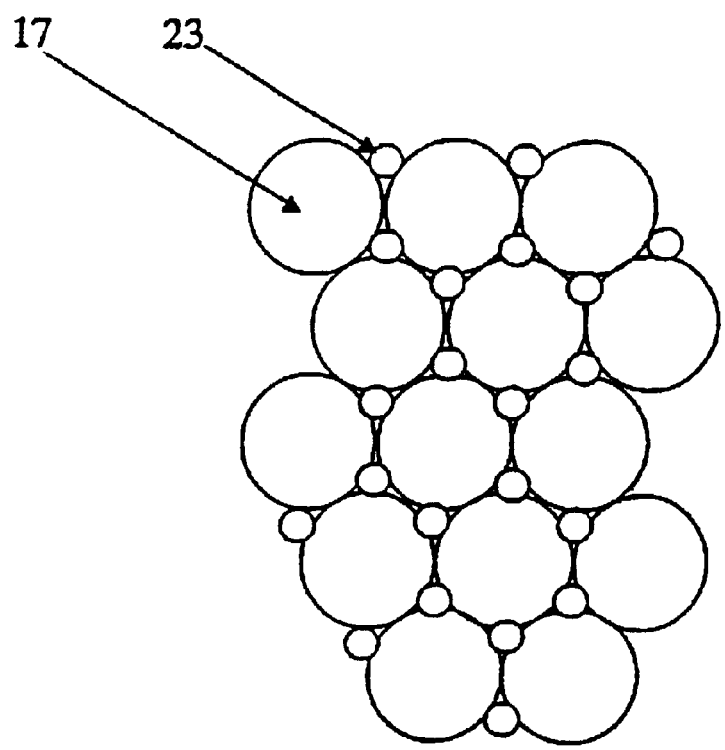
FIG. 3 is a detail view of the structure of part of the item.

As shown in FIGS. 2a and 2b, the types of powders used are designed to act as material for parts (8) of an SFF object (6), and the support (20) for objects (6). If it is required, the support can be made out of the same material as the object (6). In this instance, it is preferred that the geometry of the image allows the support (20) to form a fine structure (21) that gives an object (6) the required support during its application. The geometry of this supporting structure must also allow it to be easily removed from the object during post processing. Alternatively, the support (20) can be made out of a different material from the object (6). In this instance, it is preferred that the support (22) be made out of a material that can be mechanically removed, or dissolved away in water or an organic solvent, or combinations of these, during the post-processing. This material must be capable of supporting an object during its application, but it can be made out of fine structures (21) that aid its removal. It is also preferable that it should be solid a room temperature. Each type of powder can contain different particle sizes or distributions of particle sizes, and this can be used to enhance the properties of an object (6) or support (20 or 22). Generally, the production processes for powders become more costly and wasteful as the particle sizes become smaller. Consequently, different particle sizes can be used to reduce the cost of SFF manufacture. Materials that can be used to make an object (6) or part (8) include polymers such as nylons, polycarbonates, polystyrenes, phenolics, polyethylene, ABS or epoxies, and metals such as zinc, tin, solders, copper, stainless steels, steel, tungsten carbide/ cobalt, bronze or aluminium. Powders that are or are based on ceramic materials such as silica, zirconium silicate, molochite, china clay, alumina may also be used to make an object (6) or part (8) and alternatively the powder can comprise or incorporate a glass, or any other material that is required. A support (22) employing different material from the object (6) or parts (8) can be made with a polymer such as phenolic, epoxy, polyethylene oxide, polyethylene glycol, polyvinyl alcohol, polyvinyl acetate, poly (2-ethyl-2-oxazoline) or a nylon, or can be made with a sugar such as maltose, fructose or glucose or indeed salts such as magnesium oxide, magnesium hydroxide, calcium oxide, calcium hydroxide, sodium oxide or sodium hydroxide, sodium chloride can be used. Ceramic materials such as alumina, zirconium silicate, molochite, china clay or silica may be used, and metals such as zinc or tin may be used. Alternatively, wax, resin, gelatin, talc, starch, gum arabic may be used. A combination of any of the previously mention materials can be used. The support material may also be a material that is soluble in water or organic solvent.

Figure 4:
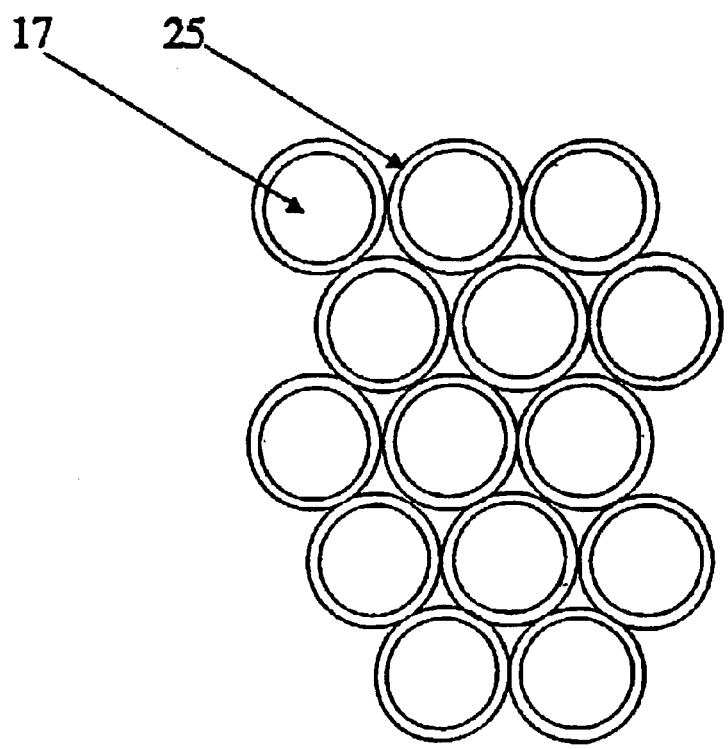
FIG. 4 is a detail view of the structure of part of an item constructed from a different powder.

As shown in FIG. 2a, low melting point material (23) can be added to high melting powders (17) to reduce the energy needed from the subsequent emitter. Material that improves the adhesion of the powders to the latent images (24) can also be added to the powders (17). If it is required these additional materials (25) can be coated onto the powders prior to their use as shown in FIG. 4. Alternatively, any other material that meets the support requirements as stated previously can be used. If more than one type of powder is needed, the powder used in the powder-coating device (62) can be changed. In another embodiment, a number of machines (60) that use thermographic principles can be used, and each powder-coating device can use a different type of powder.

As shown in FIG. 1, the powder that encounters the images (9) adheres to them (24), while the powder dusted (18) on other areas remains loose (26). The substrates (10) and their images (9) are then fed underneath a rotating coating bar (27), which is pressed against the dusted (18) substrates (10) and their images (9) to ensure even distribution, density and adherence of the powder (20).

The powder removal device (28) then vacuums the loose powder (26) away from the substrate (10), leaving the powder that has adhered to the latent image (24) in place. If required the strength of the vacuum can be altered, by adjusting a valve (29) or the vacuum motor (30) that drives it. This reduces or increases the flow (31) caused by the vacuum to suit the removal of various types of powder (26) with different particle sizes and/or masses. In addition, the adjustment can allow the vacuum to remove a percentage of the powder adhering (24) to the latent image (9), and this can be used to reduce its density. The images are developed by this adhesion (24). An arrangement that generates a vortex (32) in the vacuum's flow (31) causes the removed powder to fall into a rotating valve (33), which collects it and then repeatedly drops it back into the reservoir (13). This allows most of the unused powder (34) to be directly recycled, and the remaining small percentage will be caught in a permeable bag (35) which permits the vacuum's flow (31) and acts as a filter. If required, the bag filter (35) can be removed and tipped so that this powder falls into the reservoir (13), but it is preferred that the majority of powder in the reservoir (13) should be made up of directly recycled (34) and/or virgin powder (17). This is because the powder from the bag filter (35) is more likely to be contaminated by dust in the environment, which could detrimentally affect an SFF object. Alternatively, the powder in the bag filter (35) can be disposed of or sent away for external reprocessing.

The developed images and their substrates are then fed through an emitter (36) that exposes them to energy emissions (37), sufficient to excite the materials in the images (24), so that the powder bonds together. This takes the form of sintering or melting the powders together. The particular emitter (36) used is based on infrared emitting halogen bulbs (38). Each bulb (38) can emit one kilowatt of power in the 0.78–4.0 micron wavelengths and each of them can be independently controlled to allow its power to be increased or reduced. The total power of the emitter can be controlled by altering the power of individual bulbs (38) or selectively turning them on or off. In addition, the emitter's effect can be altered by increasing the distance between a bulb and the developed image underneath it, or by changing the shape of the bulb's reflector (39). The emitter can generate 14 kilowatts of power. This allows an energy density of 56 kilowatts per m2 to be produced and this is sufficient to melt a range of low melting point materials, such as wax, nylon, polystyrene, tin, bismuth/tin solder etc. The density is also sufficient to cure materials such as epoxies, phenolics etc.

The substrates (10) and their SFF layers are then fed into a section with an energy control device (40). The energy control device (40) controls the amount of energy that the emitter (36) does impart or has imparted to the powdered materials on the images (24). The energy control device can take the form of a temperature controller or a cooling device which can be used to cool the substrates (10) and layers (7). This allows the cooling and solidification of the layers to be controlled. The cooling also makes the substrates (10) and their layers (7) easier to transport to the subsequent finishing process.

A method is also involved in the machine (62) that uses thermographic principles, which allows the height, level and density of the layers (7) to be specified by the computer data (1) and/or the requirements of the application for an object (6). This can be achieved by setting the coating bar (27) to a specified height, which corresponds to the required thickness of a layer. The coating bar (27) compresses the dusted powder (18) to the level, height and density that has been specified. Alternatively, this can be achieved by controlling and altering the speed with which a substrate (10) and its latent image (9) are fed through the powder-coating device on the conveyor belt (70). This also allows the level and/or particle distribution in a developed image (24) to be controlled, and the method can be used in conjunction with the use of the coating bar (27). Layer (7) heights, levels and densities can be controlled by substituting powders with different particle sizes or distributions of sizes. This can also be used in conjunction with controlling and altering the speed through the powder-coating device, with the use of the coating bar (27) or combinations of these. The power of the emitter (36), its energy density, or the speed, with which a developed image (24) is fed through it, can also be altered to control the thermal deformation of the powders that are being fixed. This can also be used to achieve the height, density and level specified for a layer (7). In addition, it can also be used in conjunction with controlling and altering the speed through the powder-coating device, the use of the coating bar (27) or combinations of these.

The fixed layers (7) are then ready for a finishing process that involves bringing them into contact with required spatial orientation in relation to one another. The process involves use of an application device (64) that forms SFF objects (6) out of applied (43) layers (7). This works by applying the first layer (7) to a planar platform (44) of a series of planar platforms (44), and if more layers (7) are required they are applied (43) onto the object or objects (6) that they are forming. As each layer (7) is applied (43), its substrate (10) is removed to allow subsequent applications. The layers (7) are applied (43) in the same sequence in which they have been printed and thermographed. The precise method of application involves the use of an indexing apparatus (66), which uses movement in X, Y and Z Cartesian co-ordinates (45) to ensure that each layer (7) is applied (43) in the required spatial relationship. This works by feeding a substrate (10) and its layer (7) onto a surface (46), which keeps (47) it in position while a sensor (48) detects its indexing mark (11). The sensor (48) then signals a controller/motor arrangement (49) to move the surface (46) in the X and Y directions until the layer has the required X and Y indexing with the platform (44), object or objects (6) that are being formed. Alternatively, a sensor, controller, motor unit can index a platform with layer prior to bringing a layer into contact with a platform or a forming object. The controller/motor arrangement (49) then moves the surface in the Z direction so that its layer (7) is brought into the required Z index and into contact (50) with the platform (44), or with a forming object or objects (6). At the point of contact (50) the layer (7) adheres to the object or objects (6) or platform (44). A removal device (51) then removes the substrate (10) from its layer (7), and this applies the layer (7). The hold (47) on the substrate (10) is also released so that the next substrate (10) and layer (7) can be fed onto a surface (46) and then indexed and applied (43). The platforms (44) are cyclically moved to help achieve the required collation and indexing (7) during contact. The objects (6) are then released from the finishing process when they are finished.

The application device also ensures that the layers (7) give the physical properties of the required object (6). This involves heating controlling the layers (7) during contact. This ensures that they solidify and either adhere or partially adhere. It also involves altering and controlling the pressure at the point of contact (50). The heating device acts by resistance heating. The removal device (51) is a mechanism that peels a substrate (10) away from an applied (43) layer (7).

Following the finishing process, if an object has been made with support it will need to be post-processed (52) in known manner. This can involve dissolving a water-soluble support in water or an organically soluble support in an organic solvent, or the mechanical removal of a support, or melting away a support or burning away a support or combinations of these. If necessary, post-processed or finished objects (6) can be subjected to further energy emissions, to improve their integrity. They can be abraded, coated, infiltrated, cleaning or combinations of these to improve their quality. Further subjection can take the form of post firing of metal or ceramic objects to sinter them. Where objects are made of energy reactive material they can be post cured using the appropriate energy emissions. Furthermore, the post-processing can involve taking the objects off their platforms.

The surrounding environment can be controlled to ensure that the method of SFF manufacture functions correctly. This control could take the form of housing with proactive and preventative measures that protect against detrimental environmental interactions, so that beneficial interaction can be caused. The environmental interactions that can be controlled include temperature, dirt electrical, electromagnetic, atmospheric or combinations of these conditions. Control of the atmosphere can protect the objects (6) during their SFF manufacture from detrimental interactions, so that beneficial interaction can be caused. These beneficial interactions could be the removal of oxide, encouragement of oxidising, nitriding, carburising, prevention of oxidisation or combinations of these or any beneficial atmospheric interaction that can be controlled. This could take the form of providing a localised environment of nitrogen, argon, helium, carbon dioxide, hydrogen, carbon monoxide, oxygen or combinations of these or any atmosphere that can protect objects (6) so that beneficial interactions can be caused.

It is seen that the apparatus and method of the embodiment enable objects to be made rapidly and with superb flexibility in materials used and final properties on the surface and/or internally. The properties of the objects made can be varied through an object or between consecutive objects. The ability to use standard equipment is unique in the field and greatly reduces the cost of the apparatus.

In an alternative embodiment, the bitmap (4 or 5) is used to image surfaces such as a lithographic plate, screen, flexographic plate, metal-press or gravure plate or risographic master or similar. A computer to plate (CtP), direct imaging (DI) or screen printer that uses computer etched screens then uses the imaged surfaces to print images.

In the printing industry, it is generally accepted that CtP, DI or screen printers are more cost-effective for printing large numbers of copies of an image than jet printers are. It is also recognised that their effectiveness increases as the number of copies rises. Consequently, in a preferred embodiment, CtP, DI or screen-printing is used for producing large numbers of copies of latent images and these can be used in manufacturing duplicates of a build envelope and its objects (6) or layers (7). Jet printing is used for printing smaller numbers of copies and one-off latent images, and these can be used in manufacturing one-off or duplicate objects (6) or parts (8) of objects (6).

In an alternative embodiment, the indexing marks can be made on the substrates (10) before they are printed, and in this instance, the latent images must be printed in registration with the marks. In another embodiment, the motion of a substrate may be synchronized in such a way that registration marks are not needed on the substrate. The rate of dusting in the powder coating device (62) can be altered and controlled by tightening or loosening a mechanism (19) that increases or decreases the aperture's (14) size, or by using a different mesh (15) size, or by changing the frequency of the vibrator's (16) vibration or by combinations of these.

Without limiting the scope of the invention, the substrate may be made of different materials such as paper, silicone or vulcanised rubber, cellophane or cellulose acetate, or may be made of stainless steel, nickel, nickel alloy, platinum, platinum alloy, tantalum molybdenum, vandium, tungsten, titanium, aluminium or aluminium alloy. Alternatively, the substrate maybe made out of other engineering materials such as glass, mica, muscovite or phlogopite paper, woven or non-woven glass or long molecular chains produced from poly-paraphenylene terephthalamide (sold under the tradename Kevlar), fibre graphite composite or carbon fibre composite, or ceramic materials, such as alumina and alumina paper. Preferably, the substrate is made of a material which can be used again in the method, preferably without or with limited preparatory treatment before reuse. In another aspect of the invention the substrate is not reused and it can be dissolved, abraded, cut or burnt away or even peeled off or left in place.

Without limiting the scope of the invention, the powder-coating device (62) can be comprised differently so long as it still causes powder to adhere to the latent images and remain loose on the other areas. The differently comprised powder coating device can be based on a process that uses electrostatically attracting or repelling, electromagnetically attracting or repelling, blowing, dipping or any other process that can coat the substrate and its latent image in powder.

Without limiting the scope of the invention, other types or powder-removal devices can be used in place of the vacuum (28) so long as they remove the loose powder (26) and, preferably, recycle the majority of the unused powder (34). These other types of powder-removal devices can blow, or electrostatically attract or repel or electromagnetically attract or repel, or shake away the loose powder from the substrate.

Other kinds of inks can be used and water is one possibility that has cost and ready availability in its favour. Curable inks can also be used. The retaining material may also be or have as a constituent a solvent, organometal, glue, decomposable material, curable material or a low melting point material that may be used to reduce the energy require to bond the powders subsequently involved in the method. In addition, if the retaining material contains glue or a low melting point material this may subsequently be used to aid the separation of solid material from the substrate.

The emissions (37) can be designed to evaporate away or cure appropriate inks (12), to the degree that is required. This has the effect of fixing the images into SFF layers (7) with improved integrity Without limiting the scope of the invention, other types or arrangements of emitters can be used in place of the particular emitter described above. These other emitters can be based on resistance heating elements, ceramic infra red emitters, induction heaters, microwaves, ultrasonics, flash bulbs, ultra violet bulbs, Nd-YAG laser, diode lasers, carbon dioxide lasers, gas flame or any other type of emitter that can fix an image.

If needed, an automated method for collation (41) of the layers (7) and their substrates (10) into the required order (42) can be used.

If it is required more than one surface (46) can be used to apply (43) layers (7). In another embodiment there is only one platform (44).

Cyclical movement of a surface or surfaces over the platform or platforms (44) and forming object or objects (6) can be used as well as or alternatively to cyclical movement of the platforms (44) to help achieve the required collation and indexing (7) during contact (50).

Connecting the layers together can involve heating the layers (7) before, after or during contact, and then cooling them during or after contact (50). This ensures that they solidify and either adhere or partially adhere. It can also involve altering and controlling the pressure at the point of contact (50), and this on its own can allow adhesion in a layer (7) that is designed for contact adhesion. Alternatively, in the case where layers (7) are composed of energy reactive material, the required properties can be formed by subjecting them to the appropriate energy emissions during contact (50) causing them to cure and adhere. In the instances where heating is used the heating device can be based on resistance heating elements, ceramic infra red emitters, induction heaters, flash bulbs, diode lasers, carbon dioxide lasers, Nd-YAG lasers, gas flames, ultrasonic welders, microwave emitters etc.

The method of removing the substrates (10) can involve the use of a removal device (51) such as a milling, slicing or sanding type machine, which can also be used to level each layer before the next is applied (43). Alternatively, the removal device (51) could be a mechanism that peels a substrate (10) away from an applied (43) layer (7), or it (10) could dissolve away the substrate (10), burn, or ablate it off a layer (7). In another preferred embodiment, the substrates are not removed and the layer or layers remain on the substrate upon which they are fixed. If a substrate is peeled off, it can be recycled by sending it back to be printed on and thermographed etc. In this instance, it is preferred that the substrate (10) be made of a material such as aluminium, stainless steel or nickel, etc. because such materials are more durable and amenable to recycling. If required, they can be coated prior to printing with a material such as PTFE, PVDF, PFA or silicone, graphite, boron nitride, wax or some other release coating to aid the peel-off. If a substrate (10) is removed without peeling a clearing mechanism will be needed in the removal device (51), to clean away any remnants of the removed substrate. This could involve the use of a vacuum, brush, gas jet, liquid jet or combinations of these.

One or more printers or different types of printers can be use in the method and the machine that uses thermographic principles can be common to them or a number of machines can be specific to a particular printer. The finishing process can also be specific to a particular machine that uses themographic principles or it can be common to a number of machines. In addition, the imaging data can be specific to a particular printer or common to a number of printers. This allows SFF objects to be manufactured in concurrent or consecutive way, and the concurrent way offers the potential for substantially increasing their rate of manufacture.

Not limiting the scope of the invention a substrate can take the form of cut sheets, web fed sheet or a number of cylinders. Alternatively, the substrate can be a continuous belt that is feed through the printer, powder coating device, powder removal device, emitter, if necessary a cooling device, finishing process and back to the printer.

The substrates may additionally or alternatively have edges, holes, lumps, recesses, pins or combinations of these as registration aids. This allows a mechanical indexing apparatus to align the substrates in the X and Y directions. In this instance, such apparatuses can be used to ensure the X and Y registration throughout the entire method. In addition, devices can produce the registration aids in register with the print or prior to the printing.

If necessary an ion bar, air knife or combinations of these devices can be used to aid the removal of excess material.

Not limiting the scope of the invention the Z motion control unit may be involve the use of linear drives, ball screws, shims or any other device that can be used to control the Z movement of the surface.

In an alternative embodiment, at the same time as printing the latent images the printer prints indexing marks in register (11) with the images. In another embodiment, the indexing marks are made on the substrates (10) before they are printed, and in this instance, the latent images must be printed in registration with the marks. In both of the embodiments the indexing apparatus can be based on video or photo diode electromagnetic or similar registration control device that uses the marks for registering the substrates and their SFF layers.

In a further embodiment, the ink may be designed to allow catalytic reactions that promote or result in the solidification of a SFF layer.

What is claimed is:

1. A method of manufacturing an item comprising the steps of:
   controlling a printer (2) to print a layer (9) of retaining material in a predetermined pattern onto a substrate (10) which has registration aids for allowing mechanical indexing apparatus (66) to align the substrates (10) in the X and Y directions;
   applying a powder manufacturing material to be retained by the retaining material in substantially the predetermined pattern;
   treating the manufacturing material so that it forms a continuous solid piece (7) in substantially the predetermined shape of the pattern, or, where the pattern is made up of distinct parts, in substantially the predetermined shape of each distinct part of the pattern; and
   the assembly comprising the solid piece (7) or pieces and the substrate (10) on which it or they is or are formed being used again as the substrate in a subsequent use of the method; or the solid piece (7) or pieces being separated from the substrate (10).

2. A method as claimed in claim 1, wherein the solid piece (7) or pieces is or are a support for another solid piece or other solid pieces and is or are separated from the substrate (10) on which it is or they are formed.

3. A method as claimed in claim 1, wherein the solid piece (7) or pieces is or are a support for another solid piece or other solid pieces, and an assembly comprising the first solid piece (7) or pieces and the substrate (10) on which it is or they are formed is used again as the substrate in a subsequent use of the method of claim 1.

4. A method as claimed in claim 3, wherein the solid piece (7) or pieces is or are separated from the substrate (10) on which they are formed.

5. A method as claimed in claim 1, wherein the substrate (10) is made of a material to aid separation or includes a coating of such material.

6. A method as claimed in claim 1, wherein the substrate (10) is returned to the printer (2) after use for reuse in the method.

7. A method as claimed in claim 1, wherein support material is applied in a pattern to support the manufacturing material.

8. A method as claimed in claim 7, wherein the support material is a liquid.

9. A method as claimed in claim 8, wherein the support material is a polymer selected from phenolic, epoxy, polyethylene oxide, polyethylene glycol, polyvinyl alcohol, polyvinyl acetate, poly (2-ethyl-2-oxazoline) or nylon or the support material is a sugar selected from maltose, fructose or glucose or the support material is a salt selected from magnesium oxide, magnesium hydroxide, calcium oxide, calcium hydroxide, sodium oxide or sodium hydroxide, sodium chloride or the support material is a ceramic material selected from alumina, zirconium silicate, molochite, china clay or silica or the support material is a metal selected from zinc or tin or the support material is one of wax, resin, talc, gelatine, starch or gum Arabic, or the support material is a material that is soluble in water or organic solvent or the support material is a combination of a plurality of the previously mentioned materials.

10. A method as claimed in claim 1, wherein the manufacturing material is treated by the application of energy in the form of heat, electrons, ionising radiation or ultra violet radiation.

11. A method as claimed in claim 10, wherein the manufacturing material is treated by the application of energy in the form of heat and the manufacturing material is then cooled.

12. A method as claimed in claim 1, wherein a mechanism is used to compress and increase the density of the treated manufacturing material.

13. A material as claimed in claim 1, wherein the height of the manufacturing material is adjustably controlled.

14. A method as claimed in claim 1, wherein the method further includes the steps of aligning a plurality of the said solid pieces (7) and connecting the pieces together in a stack.

15. A method as claimed in claim 14, wherein said alignment is carried out purely mechanically.

16. A method as claimed in claim 15, wherein an indexing mark (11) is applied to each substrate (10) and the indexing mark (11) is sensed by a sensor (48) which signals a controller to control a motor unit to move the piece into alignment with the stack.

17. A method as claimed in claim 16, wherein the method includes the step of controlling the stack height.

18. A method as claimed in claim 17, wherein the pieces of solid material in layers may be connected by the controlled application of pressure and/or ultrasonic energy, heat, ultraviolet radiation, ionising radiation, organoelement, glue, solvent or combinations of these.

19. A method as claimed in claim 18, wherein the substrate (10) is removed from the manufacturing material at the stage when the solid material thereon has been placed on or connected together on the stack or platform.

20. A method as claimed in claim 1, wherein the retaining material is or has as a constituent a solvent, organometal, glue, decomposable material, curable material, a low melting point material, a printing ink or water.

21. A method as claimed in claim 1, wherein the retaining material is removed.

22. A method as claimed in claim 1, wherein the retaining material is incorporated into the finished item.

23. A method as claimed in claim 1, wherein the retaining material is colored to result in color in the manufactured item.

24. A method as claimed in claim 1, wherein the retaining material is arranged to allow catalytic reactions that promote or result in the solidification of the solid piece.

25. A method as claimed in claim 1, wherein the powder is applied by shaking powder onto the retaining material.

26. A method as claimed in claim 1, wherein a number of different manufacturing materials are applied in manufacturing of the same item.

27. A method as claimed in claim 1, wherein excess manufacturing material is removed before the step of treating the manufacturing material.

28. A method as claimed in claim 27, wherein the powder is removed by accelerating the flow of a localized zone of atmosphere that is in close proximity to the powder.

29. A method as claimed in claim 28, wherein the removed powder is recycled.

30. A method as claimed in claim 1, wherein the manufacturing material is a polymer selected from nylon, polycarbonate, polystyrene, phenolics, polyethylene, ABS or epoxies or the manufacturing material is a metal selected from zinc, tin, solders, copper, stainless steels, steel, tungsten carbide/cobalt, bronze or aluminium or the manufacturing material is a ceramic material selected from silica, zirconium silicate, molochite, china clay, alumina or the manufacturing material is a glass or the manufacturing material is a combination of a plurality of the previously mentioned materials.

31. A method as claimed in claim 1, wherein the substrate (10) is made of paper, card, silicone or vulcanized rubber, cellophane or cellulose acetate, or the substrate is made of metal selected from stainless steel, nickel, nickel alloy, platinum, platinum alloy, tantalum, molybdenum, tungsten, titanium, vanadium, aluminium or aluminium alloy or the substrate is made of composite materials selected from muscovite or phlogopite paper, woven or non-woven glass fibre, graphite composite or carbon fibre composite, long molecular chains produced from poly-paraphenylene terephthalamide, glass, mica, or the substrate is made of ceramic materials, selected from alumina and alumina paper or the substrate is made of a plurality of the previously mentioned materials.

32. A method as claimed in claim 1, wherein a computer controls the pattern that the printer (2) prints.

33. A method as claimed in claim 32, wherein the computer converts data from CAD data via a slicing algorithm into an image form.

34. A method as claimed in claim 1, wherein the printer (2) is one of a jet printer, a direct imaging printer, a computer to plate printer or a computer imaged screen printer.

35. Apparatus for manufacturing an item, the apparatus including:
    a printer (2) for printing a layer (9) of retaining material in a predetermined pattern;
    means (62) for applying a manufacturing material to be retained by the retaining material in substantially the predetermined pattern; and
    means (36) for treating the manufacturing material so that it forms a continuous solid piece (7) in substantially the predetermined shape of the pattern, or, where the pattern is made up of distinct parts, in substantially the predetermined shape of each distinct part of the pattern; wherein
    the means (62) for applying the manufacturing material is arranged to apply a powder material; characterized in that
    the printer (2) is arranged to print a layer (9) of retaining material on a substrate (10) which has X and Y direction registration aids and a mechanical indexing apparatus (66) is provided for aligning the substrates (10) in the X and Y direction; and
    means for using again as the substrate the assembly comprising the solid piece or pieces and the substrate on which it or they is or are formed; or means (51) for removing the solid piece or pieces from the substrate.

36. Apparatus as claimed in claim 35, wherein the solid piece (7) or pieces is or are a means of support for another solid piece or other solid pieces and wherein the apparatus further comprises means for separating the support from the substrate.

37. Apparatus as claimed in claim 35, wherein the solid piece (7) or pieces is or are a means of support for another solid piece or other solid pieces and wherein the apparatus further comprises means for using the assembly comprising the support and the substrate on which it is formed in place of the said substrate in the apparatus of claim 35.

38. Apparatus as claimed in claim 37, which further comprises means (51) for separating the solid piece or pieces from the substrate on which it is or they are formed.

39. Apparatus as claimed in claim 38, wherein the apparatus includes means to return the substrate to the printer after use for reuse.

40. Apparatus as claimed in claim 39, wherein the apparatus includes means to apply liquid support material in a pattern to support the manufacturing material.

41. Apparatus as claimed in claim 40, wherein the means (36) to treat the manufacturing material is arranged to apply energy in the form of heat, electrons, ionizing radiation or ultra violet radiation.

42. Apparatus as claimed in claim 40, wherein the means (36) for treating the manufacturing material is arranged to apply energy in the form of heat and to cool the manufacturing material.

43. Apparatus as claimed in claim 42, further comprising a mechanism to compress and increase the density with the treated manufacturing material.

44. Apparatus as claimed in claim 43, wherein the apparatus includes means (27) to adjustably control the height of the manufacturing material.

45. Apparatus as claimed in claim 44, wherein the apparatus includes means (66) to align a layer of the said solid piece or pieces with a stack of other layers or a platform.

46. Apparatus as claimed in claim 45, wherein alignment is carried out by purely mechanical means.

47. Apparatus as claimed in claim 45, wherein alignment is carried out by a motor, sensor (48) and controller arrangement (49) of the device.

48. Apparatus as claimed in claim 47, wherein means (66) is provided to control the stack height.

49. Apparatus as claimed in claim 48, wherein the apparatus includes means to connect the pieces of solid material in layers by the controlled application of pressure and/or ultrasonic energy, heat, ultraviolet radiation, ionizing radiation, organometal, glue, curable material, decomposable material, solvent or combination of these.

50. Apparatus method as claimed in claim 49, wherein the means for separating the substrate from the solid piece or pieces thereon is provided with or further comprises means for performing the separation at the stage when the solid material has been placed on or connected together on the stack or platform.

51. Apparatus as claimed in claim 50, wherein the apparatus includes means to remove the retaining material.

52. Apparatus as claimed in claim 51, wherein the printer (2) is arranged to print a plurality of different retaining means.

53. Apparatus as claimed in claim 52, wherein the means (62) for applying a manufacturing material is arranged to shake the powder on to the retaining material.

54. Apparatus as claimed in claim 53, wherein the means (62) for applying a manufacturing material is arranged to apply a number of different manufacturing materials.

55. Apparatus as claimed in claim 54, wherein the apparatus includes means (28) for removing excess manufacturing material.

56. Apparatus as claimed in claim 55, wherein the means for removing excess manufacturing material (28) is arranged to accelerate the flow of a localized zone of atmosphere that is in close proximity to the powder.

57. Apparatus as claimed in claim 56, wherein the apparatus includes means (33) to recycle the removed powder.

58. Apparatus as claimed in claim 57, wherein the apparatus includes a computer arranged to control the pattern that the printer (2) prints.

59. Apparatus as claimed in claim 58, wherein the computer is arranged to convert data from CAD data via a slicing algorithm into an image form.

60. Apparatus as claimed in claim 58, wherein the printer (2) is one of a jet printer, a direct imaging printer, a computer to plate printer or a computer imaged screen printer.

* * * * *